United States Patent
Swart et al.

(10) Patent No.: US 9,279,830 B2
(45) Date of Patent: Mar. 8, 2016

(54) TEST PROBE STRUCTURES AND METHODS INCLUDING POSITIONING TEST PROBE STRUCTURES IN A TEST HEAD

(75) Inventors: Roy E. Swart, Hillsboro, OR (US); Warren S. Crippen, Aloha, OR (US); Charlotte C. Kwong, Beaverton, OR (US); David Shia, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 60 days.

(21) Appl. No.: 13/976,448

(22) PCT Filed: Dec. 31, 2011

(86) PCT No.: PCT/US2011/068271
§ 371 (c)(1),
(2), (4) Date: Jun. 26, 2013

(87) PCT Pub. No.: WO2013/101238
PCT Pub. Date: Jul. 4, 2013

(65) Prior Publication Data
US 2014/0239995 A1  Aug. 28, 2014

(51) Int. Cl.
| | |
|---|---|
| G01R 31/00 | (2006.01) |
| G01R 1/067 | (2006.01) |
| G01R 1/073 | (2006.01) |
| G01R 3/00 | (2006.01) |

(52) U.S. Cl.
CPC ........ *G01R 1/06711* (2013.01); *G01R 1/07357* (2013.01); *G01R 3/00* (2013.01)

(58) Field of Classification Search
None
See application file for complete search history.

(56) References Cited

U.S. PATENT DOCUMENTS

| 6,121,058 A | 9/2000 | Shell et al. |
|---|---|---|
| 6,419,500 B1 * | 7/2002 | Kister .............................. 439/66 |
| 7,436,193 B2 | 10/2008 | Crippen |
| 7,619,424 B2 | 11/2009 | Hoshino et al. |
| 7,869,334 B2 | 1/2011 | Heck |

(Continued)

FOREIGN PATENT DOCUMENTS

| KR | 10-2007-0045348 | 5/2007 |
|---|---|---|
| KR | 10-0872065 | 12/2008 |

OTHER PUBLICATIONS

International Preliminary Report on Patentability (IPRP) for International Application No. PCT/US2011/068271, dated Jul. 10, 2014, 7 pp.

(Continued)

*Primary Examiner* — Minh N Tang
(74) *Attorney, Agent, or Firm* — Konrad Raynes Davda & Victor LLP; Alan S. Raynes

(57) ABSTRACT

The formation of test probe structures is described. One test probe structure includes a tip portion and a handle portion spaced a distance away from the tip portion. The test probe structure also includes a body bend portion positioned between the tip portion and the handle portion, and an intermediate portion positioned between the body bend portion and the handle portion. The body bend portion may include a curved shape extending from the intermediate portion to the tip portion. The tip portion may be formed to be offset from a longitudinal axis defined by the intermediate portion. The test probe structure defines a length and includes a cross-sectional area that is different at a plurality of positions along the length. Other embodiments are described and claimed.

15 Claims, 3 Drawing Sheets

(56) References Cited

U.S. PATENT DOCUMENTS

| | | |
|---|---|---|
| 8,159,256 B2 | 4/2012 | Hoshino et al. |
| 8,513,966 B2 | 8/2013 | Ma et al. |
| 2007/0007974 A1* | 1/2007 | Chiu et al. ............... 324/754 |
| 2007/0259506 A1 | 11/2007 | Hoshino et al. |
| 2008/0088327 A1* | 4/2008 | Kister ..................... 324/754 |
| 2008/0258746 A1 | 10/2008 | Tran et al. |
| 2010/0077597 A1 | 4/2010 | Hoshino et al. |
| 2011/0006796 A1 | 1/2011 | Kister et al. |
| 2012/0074979 A1* | 3/2012 | Lee et al. ............. 324/755.01 |
| 2013/0000117 A1 | 1/2013 | Baskaran et al. |
| 2013/0269173 A1 | 10/2013 | Albertson et al. |
| 2014/0210499 A1 | 7/2014 | Crippen et al. |
| 2015/0008950 A1 | 1/2015 | Swart et al. |

OTHER PUBLICATIONS

International Search Report and Written Opinion for International Application No. PCT/US2011/068271, dated Jul. 30, 2012, 10 pp.

* cited by examiner

TEST PROBE STRUCTURES AND METHODS INCLUDING POSITIONING TEST PROBE STRUCTURES IN A TEST HEAD

BACKGROUND

Test probes are typically used to provide an electrical path between a test system and circuits on a wafer or die, thereby permitting the testing and validation of the circuits thereon, before they are packaged. The test probes are often long and narrow, and are fit within a test head that holds the probes in place. Up to thousands of test probes may fit within a test head. The device to be tested is moved relative to the test head to bring the pads on the device to be tested into contact with the probes. Test probes are becoming more difficult to manufacture due to the continued scaling of Moore's law for interconnect pitch and the complexity of electrical and mechanical requirements for high volume manufacturing testing.

BRIEF DESCRIPTION OF THE DRAWINGS

Embodiments are described by way of example, with reference to the accompanying drawings, which are not drawn to scale.

DETAILED DESCRIPTION

Reference below will be made to the drawings wherein like structures may be provided with like reference designations. In order to show the structures of various embodiments most clearly, the drawings included herein include diagrammatic representations of various structures. Thus, the actual appearance of the fabricated structures may appear different while still incorporating the claimed structures of the illustrated embodiments. Moreover, the drawings may show only the structures necessary to understand the illustrated embodiments. Additional structures known in the art have not been included to maintain the clarity of the drawings.

Figure 1:
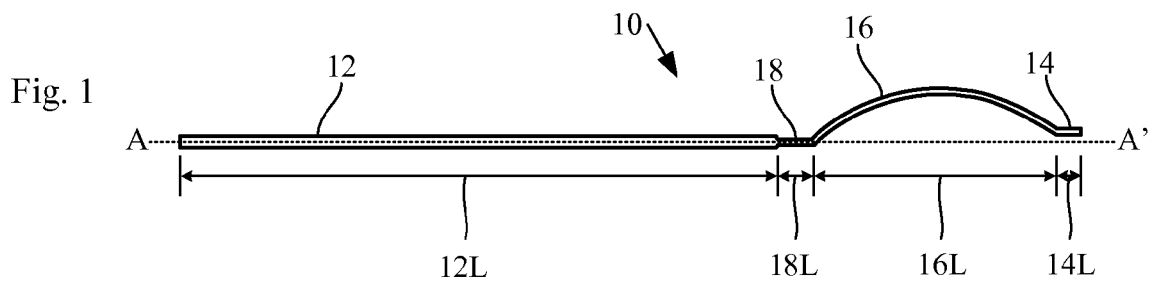
FIG. 1 illustrates a test probe structure including a handle portion, in accordance with certain embodiments.

Certain embodiments relate to the formation of test probes. FIG. 1 illustrates a test probe structure 10 in accordance with certain embodiments. The test probe structure 10 includes a handle portion 12 at one end and a tip portion 14 at another end. The test probe structure 10 also includes a body bend portion 16 extending from the tip portion 14, and an intermediate portion 18 between the handle portion 12 and the body bend portion 16. A longitudinal axis A-A' extends along a longitudinal direction through the intermediate portion 18 and handle portion 12. As illustrated in FIG. 1, in one aspect of certain embodiments, the tip portion 14 is offset from the axis A-A'. It is believed that the offset assists in producing a controlled scrub for establishing good contact with a pad on a device to be tested. By offset it is meant that the tip portion 14 does not extend along the axis A-A'. As illustrated in FIG. 1, the tip portion may extend in a direction parallel to the axis A-A'. The distance the tip portion 14 is offset from the axis A-A' may vary. In certain embodiments, the tip is offset by a distance in the range of 10 µm (microns) to 200 µm, measured from the center of the axis A-A' to the center of the tip portion 14. Other offset distances are also possible. A more specific range that provides favorable properties in certain embodiments includes an offset in the range of 60 µm to 120 µm.

In another aspect of certain embodiments, the probe structure 10 may include a relatively large body bend portion 16 that acts as a spring body that combines cantilever behavior with buckling to produce a low force for low stress and high lifetime. By buckling it is meant that the probe can bend and thus dampen and/or regulate the application of force from the probe tip onto a pad surface. In certain embodiments, the body bend portion 16 may be formed with a longitudinal length 16L in the range of from 1500 µm to 2500 µm. Other lengths are also possible. When compared to the length of the probe from the intermediate portion 18 to the tip portion 14, the body bend portion 16 may in certain embodiments be formed to be greater than half of the combined length of the intermediate portion 18, the body bend portion 16, and the tip portion 14. Certain embodiments may also include a body bend portion 16 that is formed to be about 50-90 percent of the combined length of the intermediate portion 18, body bend portion 16, and tip portion 14, with a more preferred range in certain embodiments of 70 to 85 percent. In one embodiment, for a probe having an intermediate portion length 18L of 300 µm and a tip portion length 14L of 250 µm, a body bend portion length 16L of 2000 µm may be utilized.

In another aspect of certain embodiments, the probe structure 10 may include a relatively large arc-shaped bend in the body bend portion 16. The large bend enables the probe to tolerate a high compression, which may be present in certain probes due to module stack-up variability. In certain embodiments, the arc-shaped bend defines a radius that is about three fourths of the length of the body bend portion 16. In one embodiment having a body bend portion length 16L of 2000 µm, the body bend portion 16 may take the shape of an arc defining a radius of 1490 µm.

In another aspect of certain embodiments, one or both end regions of the probe may be formed to be larger than conventional probe structures. For example, certain embodiments form the probe structure 10 to include additional length at the tip portion 14 that is designed to contact a pad on a device to be tested. By providing additional length, there is length that can be removed during processes such as planarization, so that multiple probe structures mounted in a test head can all be planarized at the same time and there is enough extra length in the tip portion 14 so that probe to probe length variations can be accounted for and all the probes in a test head can be planarized. In certain embodiments, the tip portion 14 may be formed to have a length 14d in the range of 250 µm to 500 µm. Other lengths are also possible.

In another aspect of certain embodiments, the intermediate portion 18 positioned between the handle portion 10 and the body bend portion 16 may have a length in the range of from 200 µm to 400 µm. Other lengths are also possible.

In addition, certain embodiments provide a probe structure including an elongated handle portion 12, as illustrated in FIG. 1. The elongated handle portion 12 enables the probe structure 10 to be more easily grasped due to the additional length. Furthermore, the handle portion 12, in certain embodiments, may be formed to include at least a portion thereof having a cross-sectional diameter that is larger than that of the intermediate portion 18 of the probe structure. In certain embodiments, the handle portion 12 may have a length in the range of from 2000 µm to 5000 µm. Another way to express the length of the handle portion 12 is that it may be about twice as long as the rest of the probe structure 10. As illustrated in FIG. 1, the handle portion length 12L may be about two times the total length of intermediate portion length 18L, body bend portion length 16L, and tip portion length 14L. In one embodiment, the probe structure illustrated in FIG. 1 may be formed to include a handle portion length 12L of 5000 μm, an intermediate portion length 18L of 300 μm, a body bend portion length 16L of 2000 μm, and a tip portion length 14L of 250 μm.

In another aspect of certain embodiments, the handle portion 12 is designed to be removed from the intermediate portion 18 after the probe structure 10 is positioned in a test head.

In another aspect of certain embodiments, different portions of the probe structure 110 may have different cross-sectional areas. For example, as illustrated in FIG. 1, the handle portion 12 has a cross-sectional area that is larger than the other portions of the probe 10. For example, the handle portion 12 may in certain embodiments have a cross section with a width of about 50 μm and a height of about 100 μm, whereas other portions of the probe have a width of about 50 μm and a height of about 40 μm. The additional height of the handle portion 12 enables easier handling of the probe structure 10 while minimizing the risk of damage to the other portions of the probe structure 10.

Figure 2:
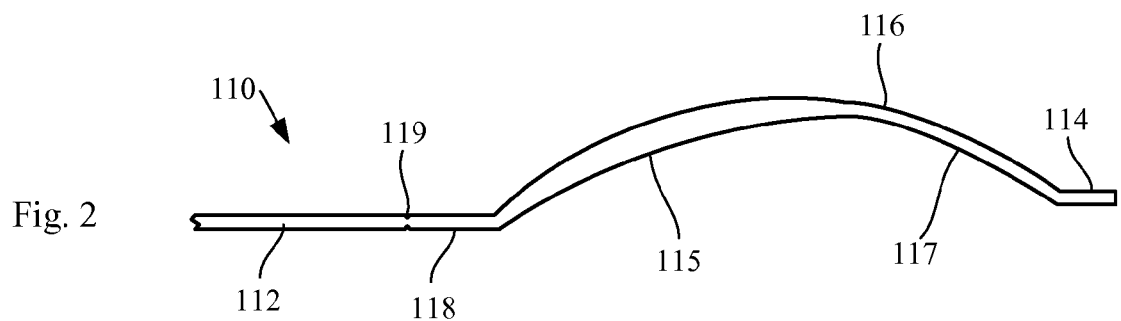
FIG. 2 illustrates a test probe structure including a body bend portion having a variable cross-sectional area, in accordance with certain embodiments.

FIG. 2 illustrates a probe structure 110 in accordance with certain embodiments, including a handle portion 112, an intermediate portion 118, a body bend portion 116, and a tip portion 114. The body bend portion 116 includes a variable cross-sectional area along its length. For example, as illustrated in FIG. 2, position 115 on the body bend portion 116 has a larger cross-sectional area than position 117. The larger cross-sectional area enables that portion of the probe 110 to carry more current or reduce the mechanical stress. In general, as electronic devices get smaller and test probes get smaller, the probe cross section is reduced, and the ability of the probe to carry current to a device under test is also reduced. This is because a reduced cross section leads to a higher resistance, which results in the probe heating up during application of current during testing. The greater the current load the system carries, the greater the heat that is generated. If the heat generated increases to high enough levels, damage to the probe may occur, reducing contact force and leading to failure of the probe. Among the factors that may influence where the highest heat is located on a probe are the shape and cross-sectional area of the probe. Bends and curved portions of the probe may be regions having increased resistance. A reduced cross-section also results in higher mechanical stress and reduced probe lifetime. Among the factors that may influence where the highest stress is located on a probe are the shape and cross-sectional area of the probe. Bends and curved portions of the probe may be regions having increased stress. In the embodiment illustrated in FIG. 2, by forming the position 115 to have a larger cross-sectional area, it will be able to carry a greater current and tolerate a higher load than if it had a smaller cross-sectional area. If there are multiple positions of increased resistance or stress, then multiple positions on the probe may be formed to have larger cross-sectional areas. In certain embodiments, positions along the tip portion 214 and the body bend portion 216 may have larger cross-sectional areas to enable higher current carrying capability and greater lifetime.

In another aspect of certain embodiments, the probe 110 includes a notch 119 at the intersection of the handle portion 112 and the intermediate portion 118. The notch 119 enables the handle portion 112 to be reliably detached from the rest of the probe 110 after the probe 110 has been positioned in a test head.

Figure 3:
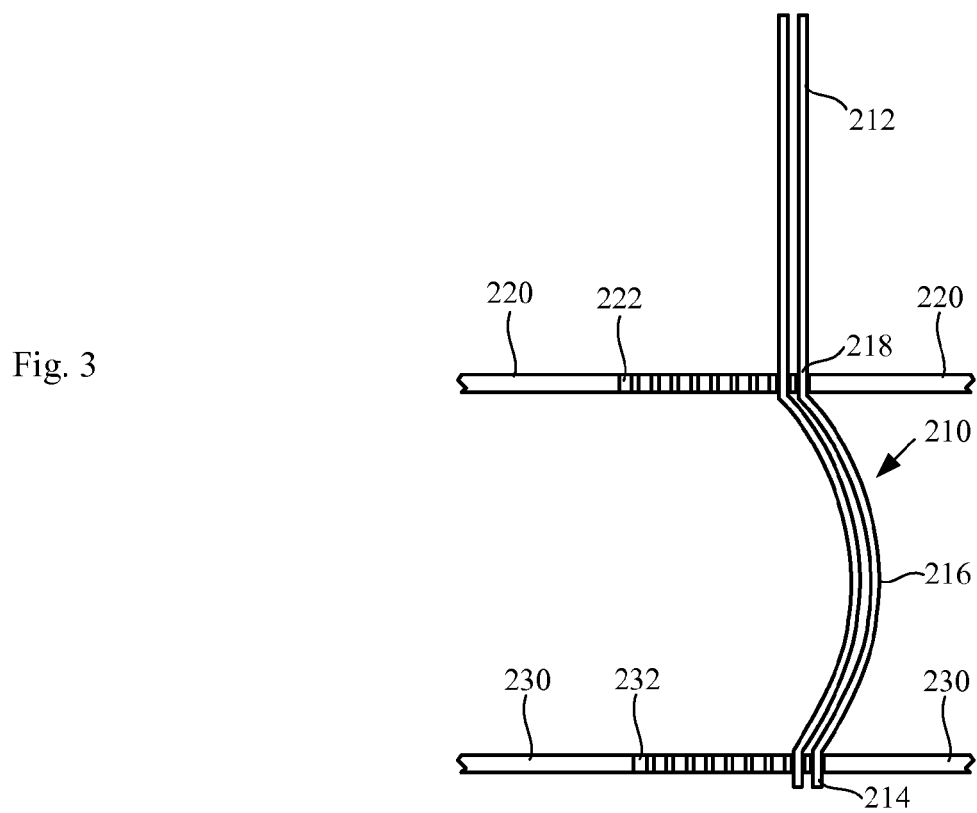
FIG. 3 illustrates test probes positioned in a test head, in accordance with certain embodiments.

FIG. 3 illustrates two probes 210 positioned in an upper guide plate 220 and lower guide plate 230 of a test head. The upper guide plate 220 includes a plurality of openings 222 sized to accept a probe 210 therein. The lower guide plate 230 includes a plurality of openings 232 sized to accept the probe 210 therein. In the embodiment of FIG. 3, a part of the intermediate portion 218 of the probe 210 is positioned within one of the openings 222 in the upper guide plate 220, and a part of the tip portion 214 is positioned within one of the openings 232 in the lower guide plate 230. The body bend portion 216 is positioned between the upper guide plate 220 and the lower guide plate 230. The handle portion 212 extends above the upper guide plate 220. The guide plates 220, 230 may be configured to accept a large array of probes therein.

Figure 4:
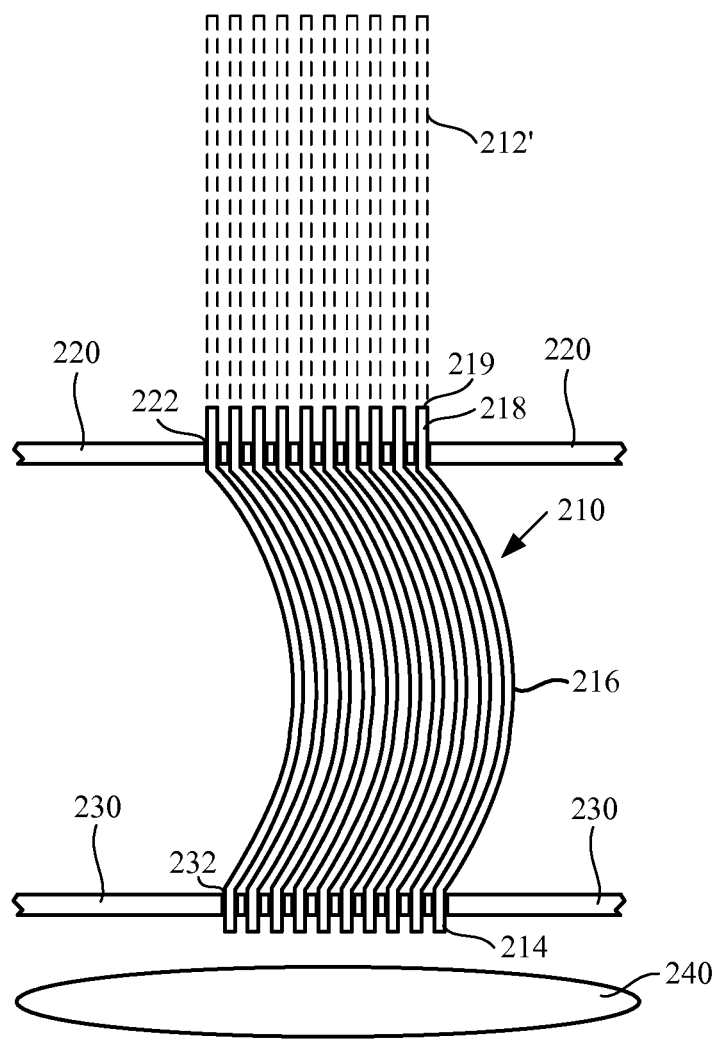
FIG. 4 illustrates test probes positioned in a test head and a polishing disk used to planarize one or both ends of the probes, in accordance with certain embodiments.

After the test head is filled with probes, the probes may be processed while positioned in the test head. For example, one or both ends of the test probes may be planarized. FIG. 4 illustrates the upper guide plate 220 and lower guide plate 230 of FIG. 3, filled with probes 210. A polishing disk 240 is positioned adjacent to the tip portion 214 of the probes 210 and the probes may be brought into contact with the polishing disk 240 to planarize the end of each tip portion 214 on the probes 210.

The other end of the probes 210 may also be processed. As illustrated in FIG. 4, after being mounted in the upper guide plate 220, the handle portion 212 of each of the probes 210 may be removed, as indicated by the dotted lines 212'. As noted above, a notch such as the notch 119 of FIG. 2 may be formed in the probes 210 to facilitate separating the handle portion 212 from the intermediate portion 218 of each probe 210. Once the handle portions 212 are removed, the end 219 of the intermediate portion 218 on each probe 210 may be processed (for example, planarized), using the polishing disk 240 in a manner similar to the planarizing of the tip portions 214. The end 219 may be referred to as the distal end of the probe 210, and the intermediate portion 218 may be referred to as a distal portion of the probe 210 once the handle portion (as indicated by reference number 212') has been removed.

The test head (including the upper guide plate 220 and lower guide plate 230) may be moved, rotated, etc., in order to process different portions of the probes 210. Other processing operations such as forming a coating on the probes 210, sharpening the probes 210, or heat treating the probes 210, may be carried out while the probes are in the test head.

Figure 5:
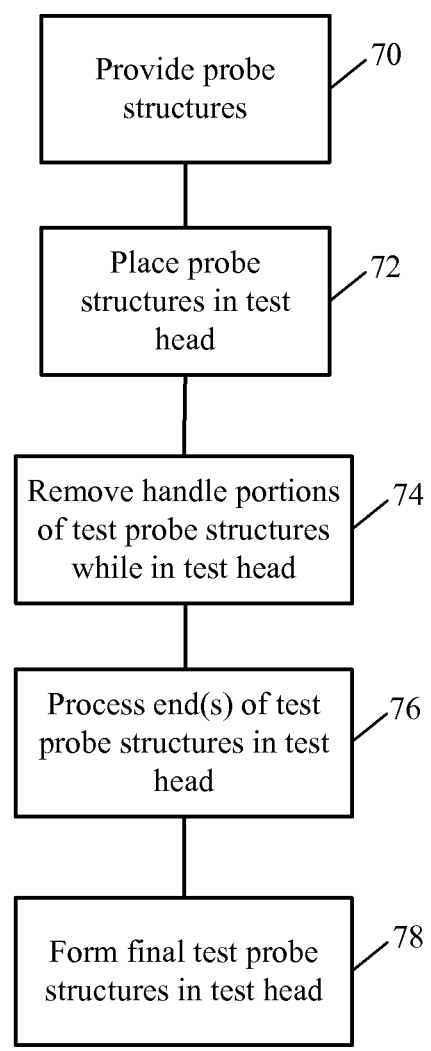
FIG. 5 illustrates a flowchart of operations for processing test probes in a test head, in accordance with certain embodiments.

FIG. 5 is a flowchart of operations that may be carried out in accordance with certain embodiments. Box 70 is providing a plurality of test probe structures. Box 72 is positioning the probe structures in a test head. The test head may include one or more guide plates such as the guide plates 220, 230 illustrated in FIG. 4. Box 74 is removing the handle portions of the test probes after the probes are in the test head. The handle portions, such as the handle portions 12, 112, and 212 illustrated in FIGS. 1-3, generally assist in the initial formation and processing of each probe because the handle portion enables the probe to be held without contacting the tip or other portions thereof, thus limiting the possibility of damaging the other portions of the probe. Once the probe is positioned in the test head, it will be held in place in the test head so the handle is no longer necessary. As a result, the handle portion may then be removed from the rest of the probe structure. Box 76 is processing the end or ends of the probes. In certain embodiments, both the tip end and the intermediate portion end (distal portion end) of the probe may be processed, for example, planarized. Other processing operations on the probe ends and on the other portions along the length of the probes (e.g., body bend portion) may also be processed (for example, shaping, sharpening, etching, coating, etc.). Box 78 indicates the formation of the final probe structure in the test head that will be used during device testing.

Terms such as "first", "second", and the like may be used herein and do not necessarily denote any particular order, quantity, or importance, but are used to distinguish one element from another. Terms such as "upper", "lower", "top", "bottom", and the like may be used for descriptive purposes only and are not to be construed as limiting. Embodiments may be manufactured, used, and contained in a variety of positions and orientations. The term metal as used herein includes pure metals and alloys.

In the foregoing Detailed Description, various features are grouped together for the purpose of streamlining the disclosure. This method of disclosure is not to be interpreted as reflecting an intention that the claimed embodiments of the invention require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate embodiment.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. A test probe structure comprising:
   a tip portion;
   a handle portion spaced a distance away from the tip portion;
   a body bend portion positioned between the tip portion and the handle portion;
   an intermediate portion positioned between the body bend portion and the handle portion;
   the body bend portion including a curved shape extending from the intermediate portion to the tip portion;
   the tip portion being offset from a longitudinal axis defined by the intermediate portion;
   the test probe structure defining a length and including a cross-sectional area that is different at a plurality of positions along the length; and
   wherein the handle portion has a cross-sectional area that is greater than that of the intermediate portion.

2. The test probe structure of claim 1, wherein the handle portion has a length that is greater than that of a combined length of the intermediate portion, the body bend portion, and the tip portion.

3. The test probe structure of claim 1, wherein the body bend portion defines a first position and a second position along a length thereof, and wherein the first position has a cross-sectional area that is different than that of the second position.

4. The test probe structure of claim 1, wherein the intermediate portion, the body bend portion, and the tip portion together define a first length, and wherein the body bend portion defines a second length, and wherein the second length is in a range of 50 percent to 90 percent of the first length.

5. The test probe structure of claim 1, wherein the intermediate portion, the body bend portion, and the tip portion together define a first length, and wherein the body bend portion defines a second length, and wherein the second length is in a range of 70 percent to 85 percent of the first length.

6. The test probe structure of claim 1, the tip portion being offset from the longitudinal axis defined by the intermediate portion by a distance of 10 µm to 200 µm.

7. The test probe structure of claim 1, the tip portion being offset from the longitudinal axis defined by the intermediate portion by a distance of 60 µm to 120 µm.

8. A test probe structure comprising:
   a tip portion;
   a handle portion spaced a distance away from the tip portion;
   a body bend portion positioned between the tip portion and the handle portion;
   an intermediate portion positioned between the body bend portion and the handle portion;
   the body bend portion including a curved shape extending from the intermediate portion to the tip portion;
   the tip portion being offset from a longitudinal axis defined by the intermediate portion;
   the test probe structure defining a length and including a cross-sectional area that is different at a plurality of positions along the length; and
   a notch formed in the test probe structure, the notch extending inward into the test probe structure, the notch positioned at an intersection of the handle portion and the intermediate portion, wherein the cross-sectional area of the test probe structure at the notch is smaller than that of the handle portion adjacent to the notch, and wherein the cross-sectional area of the test probe structure at the notch is smaller than that of the intermediate portion adjacent to the notch.

9. A method comprising:
   providing a test probe structure including:
      a tip portion;
      a handle portion spaced a distance away from the tip portion;
      a body bend portion positioned between the tip portion and the handle portion;
      an intermediate portion positioned between the body bend portion and the handle portion;
      the body bend portion including a curved shape extending from the intermediate portion to the tip portion;
   providing a test head including a first guide plate and a second guide plate spaced a distance away from the first guide plate;
   positioning the test probe structure in the test head so that the test probe structure extends through the first guide plate and the second guide plate;
   the body bend portion positioned between the first guide plate and the second guide plate;
   the tip portion extending outward from the second guide plate;
   the handle portion extending outward from the first guide plate; and
   detaching the handle portion from the intermediate portion after the positioning the test probe structure in the test head, wherein the intermediate portion, the body bend portion, and the tip portion remain positioned in the test head.

10. The method of claim 9, further comprising processing the tip portion after the detaching the handle portion.

11. The method of claim 9, further comprising processing the intermediate portion after the detaching the handle portion.

12. A method comprising:
positioning a plurality of test probe structures in a test head;
the test probe structures positioned in the test head so that a tip portion of each of the test probe structures extends from a first part of the test head, and a handle portion of each of the test probe structures extends outward from a second part of the test head;
detaching the handle portions of the test probe structures while the test probe structures are positioned in the test head; and
processing the tip portions of the test probe structures while the test probe structures are positioned in the test head.

13. The method of claim 12, wherein the processing the tip portions comprises planarizing the tip portions.

14. The method of claim 12, wherein the detaching the handle portions of the test probe structures comprises exposing distal ends of the test probe structures, and further comprising processing the distal ends of the test probe structures while the test probe structures are positioned in the first part and the second part of the test head.

15. The method of claim 14, wherein the processing the distal ends comprises planarizing the distal ends.

\* \* \* \* \*